United States Patent [19]
Hancock

[11] Patent Number: 5,795,824
[45] Date of Patent: Aug. 18, 1998

[54] METHOD FOR NUCLEATION OF CVD TUNGSTEN FILMS

[75] Inventor: Shawn Diane Hancock, Alviso, Calif.

[73] Assignee: Novellus Systems, Inc., San Jose, Calif.

[21] Appl. No.: 919,384

[22] Filed: Aug. 28, 1997

[51] Int. Cl.[6] .................................................. C23C 16/08
[52] U.S. Cl. .................. 438/656; 438/674; 438/677; 427/253; 427/255; 427/255.1; 427/255.7
[58] Field of Search .................................... 427/250, 253, 427/255, 255.1, 255.2, 255.7; 437/674, 656, 677

[56] References Cited

U.S. PATENT DOCUMENTS

| | | | |
|---|---|---|---|
| 4,650,698 | 3/1987 | Moriya et al. | 427/253 |
| 5,272,112 | 12/1993 | Schmitz et al. | 437/192 |
| 5,342,652 | 8/1994 | Foster et al. | 427/253 |
| 5,472,508 | 12/1995 | Sexena | 118/723 E |

OTHER PUBLICATIONS

F. Cumplan et al., "Parametric Study of $H_2$ Doped $SiH_4/Wf_6$ Nucleation on Ti/TiN by Tungsten CVD Process," Advanced Metallization and Interconnect Systems for ULSI Application in Oct. 1995, pp. 529–534

*Primary Examiner*—Shrive Beck
*Assistant Examiner*—Timothy Meeks
*Attorney, Agent, or Firm*—Skjerven, Morrill, MacPherson, Franklin & Friel; David E. Steuber; Bernard Berman

[57] ABSTRACT

A tungsten (W) film is formed on a surface of a semiconductor substrate by providing to that surface gas mixtures tailored for both reduced gas phase nucleation of particulates (GPN) and attack of exposed silicon (Si) or titanium (Ti) surfaces (Device Attack) while maintaining a high W deposition rate. An initiation step is performed where the surface is preconditioned with hydrogen ($H_2$) and silane ($SiH_4$). A subsequent nucleation step then uses a mixture of $H_2$ and $SiH_4$ to reduce tungsten hexafluoride ($WF_6$) and thus form a first thickness of the W film. In some embodiments, an alternate gas mixture can be employed to form a second thickness of W on the surface of the semiconductor substrate.

6 Claims, 4 Drawing Sheets

METHOD FOR NUCLEATION OF CVD TUNGSTEN FILMS

BACKGROUND

1. Field of the Invention

The present invention relates to the chemical vapor deposition of a tungsten film, and more particularly, to the nucleation of that deposition process on a semiconductor substrate with reduced gas phase particle formation and tungsten attack.

2. Description of the Related Art

The deposition of blanket tungsten (W) films using chemical vapor deposition (CVD) techniques is an integral part of many semiconductor fabrication processes. Typically the W film is deposited through the reduction of tungsten hexafluoride ($WF_6$) by hydrogen ($H_2$) or silane ($SiH_4$).

When $H_2$ is used as the reducing agent, the reaction has been found to (1) be rate-limited by the dissociation of $H_2$ into atomic H on the reaction surface; (2) produce a film with significant surface roughness; and (3) cause damage to device structures due to undesirable reactions at exposed Si and Ti surfaces. These undesired reactions lead to device performance problems such as high leakage current, high contact resistance and W film adhesion problems, and are often referred to as Device Attack.

$SiH_4$ reduction of $WF_6$, unlike $H_2$ reduction, is not rate-limited by a dissociation step on a reactive surface. Therefore, $SiH_4$ reductions can result in higher W film deposition rates than $H_2$ reductions, when sufficient concentrations of $SiH_4$ are provided. At the same time, $SiH_4$ reduction reduces the tendency for Si and Ti attack by $WF_6$ or HF (HF is a formed in the $H_2$ reduction of $WF_6$). However, as the $SiH_4$ reduction of $WF_6$ to metallic W does not require a reactive surface, it can occur in the gas phase. This gas phase reduction or Gas Phase Nucleation (GPN) can lead to high particle counts in the deposition chamber and the subsequent incorporation of these particles into the deposited film. Thus, GPN like Device Attack can be a significant problem in blanket W depositions and typically conditions that reduce one problem promote the other. As a result, deposition processes must balance one against the other.

Another difficulty with blanket W depositions is the poor adhesion of the CVD W films to some insulating layers, for example silicon oxide, silicon nitride and the like. W adhesion can be enhanced through the deposition of an intermediate or adhesion film overlying the substrate surface and insulating layers. This adhesion film is most commonly a binary titanium/titanium nitride (Ti/TiN) layer or bilayer. Ti/TiN films have been found to be superior, with regard to contact-resistance values and resistance to typical W etch conditions, to other possible materials.

While it might seem that this Ti/TiN layer could prevent Si reduction of $WF_6$ during W depositions that use $H_2$ as the reducing agent, in practice this problem can actually be enhanced. The Ti/TiN surface is not very reactive toward $H_2$ dissociation; hence, the rate of dissociation is slowed and W film growth rate reduced. Thus while little or no Si may be exposed, the slowed W film growth rate allows time for any small area of exposed Si or weak spot in the Ti/TiN film to become a site for W rich nodule growth or Device Attack. In addition, $WF_6$ can react with Ti if the TiN barrier is breached to form $TiF_x$. This reaction is commonly referred to as Ti attack and results in defects called volcanoes that reduce the integrity of the W film.

One prior art attempt to make such a trade-off, F. Cumpian et al. "*Parametric Study of $H_2$ Doped $SiH_4/WF_6$ Nucleation on Ti/TiN by Tungsten CVD Process*", Proceedings of the Conference on Adv. Metallization and Interconnect Systems for ULSI Applications in 1995, pp. 529–534, (October, 1995), reported that both $H_2$ and $SiH_4$ were provided as reducing agents for a W deposition on a Ti/TiN coated substrate. While Cumpian et al. state that the addition of $H_2$ to $SiH_4$ eliminates defects caused by Ti attack, no mention of any effect on GPN or Si attack is made. In addition, Cumpian et al. reported a W growth rate plateau at approximately 80 nanometers/minute (nm/min).

Therefore, it would be advantageous to have a method of depositing a blanket W film that has little or no particulate formation due to GPN. It would also be advantageous to have a method of W deposition that has little or no undesirable chemical reactions taking place (Si or Ti attack). In particular, it would be advantageous to have a W film deposition process that provides for little or no GPN or Device Attack. Finally, it would be advantageous to have a W blanket film deposition process that provides both GPN and Device Attack reduction enhancements at deposition rates in excess of 100 nm/min, without adding additional costs resulting from reduced yields, additional process steps or costly process equipment or reagents.

SUMMARY

In accordance with the present invention, a tungsten film is deposited on a semiconductor substrate in two or more discrete stages at two or more discrete stations. The first stage of the deposition is an initiation/nucleation stage. This first stage first introduces initiation gases and then nucleation gases to a surface of the semiconductor substrate. The result is the nucleation of the tungsten film. These initiation/nucleation gases, their composition and flow rate, in combination with the temperature of the surface of the semiconductor substrate and the pressure of the reaction chamber, provide for the reduction or elimination of Gas Phase Nucleation (GPN), and Device Attack during the nucleation of the tungsten film.

In some embodiments of the present invention, the initiation/nucleation stage is performed at an initiation/nucleation or first station that is one of five deposition stations positioned within a single deposition chamber. Both initiation and nucleation gases are introduced to the surface of the semiconductor substrate, at the first station, using an individual gas supply system that creates a localized atmosphere at the substrate surface. After nucleation of the tungsten film is complete, the nucleation gases are turned off. The semiconductor substrate, having a first thickness of W deposited at a first rate, is then moved to a second deposition station and a new wafer is moved into place on the first station. The full thickness of the W film is achieved by additional W depositions at each of the other deposition stations. Thus a cycle of nucleation steps and other deposition steps is established until all substrates are coated to the desired thickness. Any number of deposition stations, each capable of having a localized atmosphere isolated from adjacent stations, are possible within the single chamber.

BRIEF DESCRIPTION OF THE DRAWINGS

The present invention may be better understood, and its numerous objects, features, and advantages made apparent to those skilled in the art by referencing the accompanying drawings. For ease of understanding and simplicity, common numbering of elements within the illustrations is employed where the element is the same between illustrations.

DETAILED DESCRIPTION

Embodiments of the present invention will be described with reference to the aforementioned figures. These figures are simplified for ease of understanding and description of embodiments of the present invention only. Modifications, adaptations or variations of specific methods and or structures shown and discussed herein may become apparent to those skilled in the art. All such modifications, adaptations or variations that rely upon the teachings of the present invention, and through which these teachings have advanced the art, are considered to be within the spirit and scope of the present invention.

Figure 1:
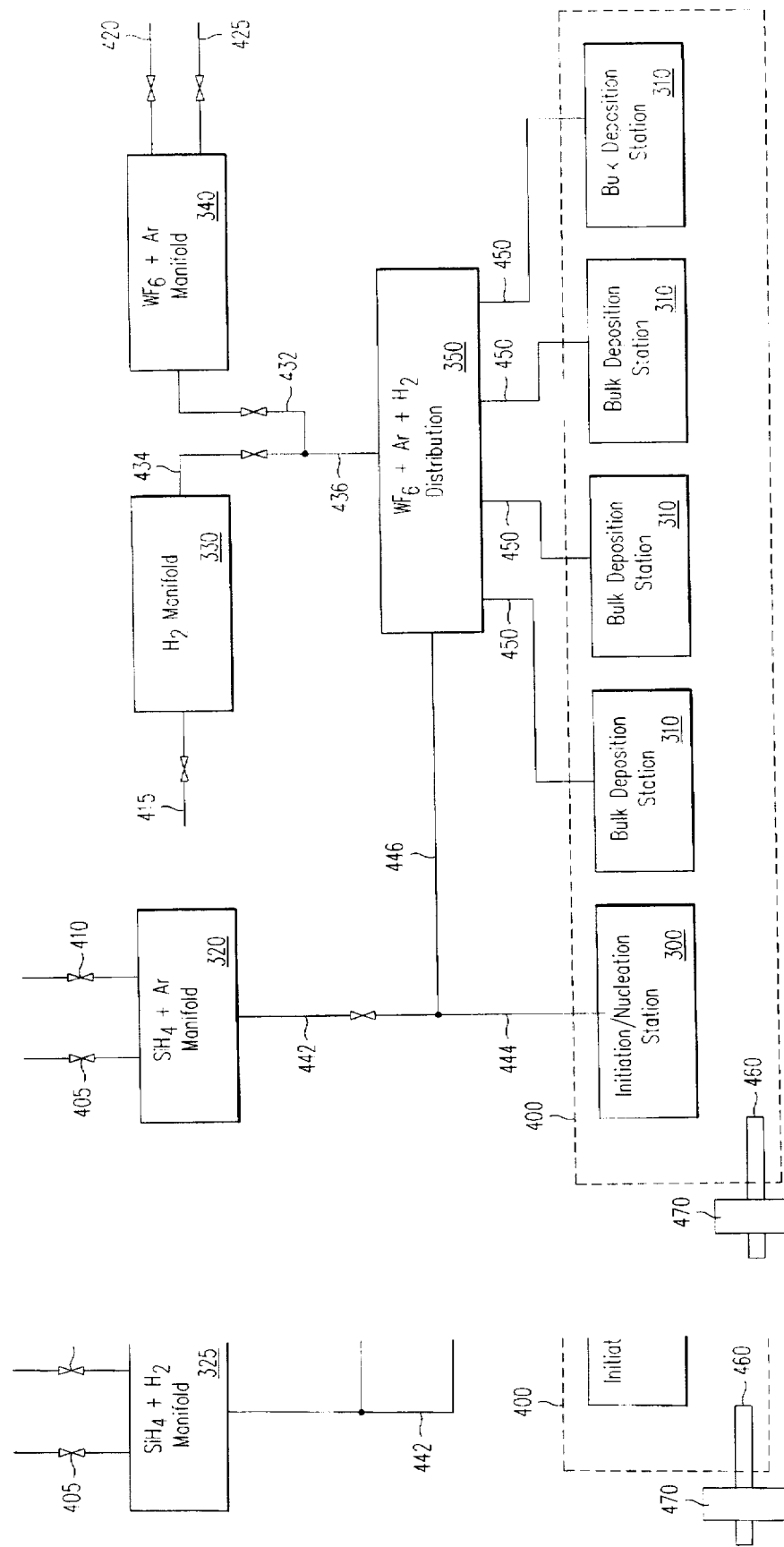
FIG. 1 is a schematic diagram of a deposition system capable of performing a prior art tungsten deposition.

FIG. 1 is a schematic representation of a deposition system configured for a blanket tungsten (W) process in the manner of the prior art. Nucleation station 300 and four bulk deposition stations 310 are shown within vacuum chamber 400. Vacuum chamber 400 has a vacuum pumping port 470 coupled to a vacuum pump (not shown) through a pressure control device 460, for example a throttle valve, positioned appropriately therein. As known, the combination of port 470 and control device 460 coupled to chamber 400 can serve to maintain chamber 400 at a predetermined pressure as required by the specific process in use.

Each deposition station 310 has a process gas distribution line 450 coupled to a gas distribution manifold 350. Distribution manifold 350 supplies tungsten hexafluoride ($WF_6$), argon (Ar) and hydrogen ($H_2$) gases through distribution lines 450 to stations 310 for the deposition of a W film, as will be discussed hereinafter. $WF_6$, Ar and $H_2$ gases are supplied to distribution manifold 350 through common gas line 436, which in turn is coupled to $H_2$ manifold 330 through valved $H_2$ line 434 and to $WF_6$+Ar manifold 340 through valved $WF_6$+Ar line 432. Manifolds 330 and 340 are furnished with reagent gases through valved input lines that are coupled to specific reagent gas sources (not shown). Thus, $H_2$ is supplied to manifold 330 through valved input line 415 and $WF_6$ and Ar to manifold 340 through valved input lines 420 and 425, respectively. In this manner, each deposition station 310 is uniformly supplied with reagent gases from a single distribution manifold 350.

Initiation/nucleation station 300 differs from stations 310 in that it is coupled to $SiH_4$+Ar manifold 320 in addition to distribution manifold 350. Thus, a mixture of $SiH_4$ and Ar are supplied to station 300 from manifold 320 via gas distribution line 444 and valved line 442, while reagent gases from manifold 350 are delivered via distribution line 444 and 446 as shown. As described for manifolds 330 and 340, manifold 320 is supplied with reagent gases through input lines. Thus, input line 405 supplies $SiH_4$ to manifold 320 and input 410 supplies Ar. In this manner, nucleation station 300 has an independent supply of $SiH_4$.

Each deposition station 310 and the initiation/nucleation station 300 have a heated substrate platen (not shown) for holding and heating a substrate (not shown) to a predetermined temperature and a gas distribution head (not shown) for dispersing the supplied gases over the substrate. In addition, each station 300 and 310 has a backside gas distribution system (not shown), to prevent deposition of the W film on the backside of the substrate, and a vacuum clamping manifold (not shown) for clamping the substrate to the platen. Finally, chamber 400 is equipped with a transport system (not shown) for transporting wafers or substrates into and out-of the chamber as well as between deposition stations.

Figure 2:
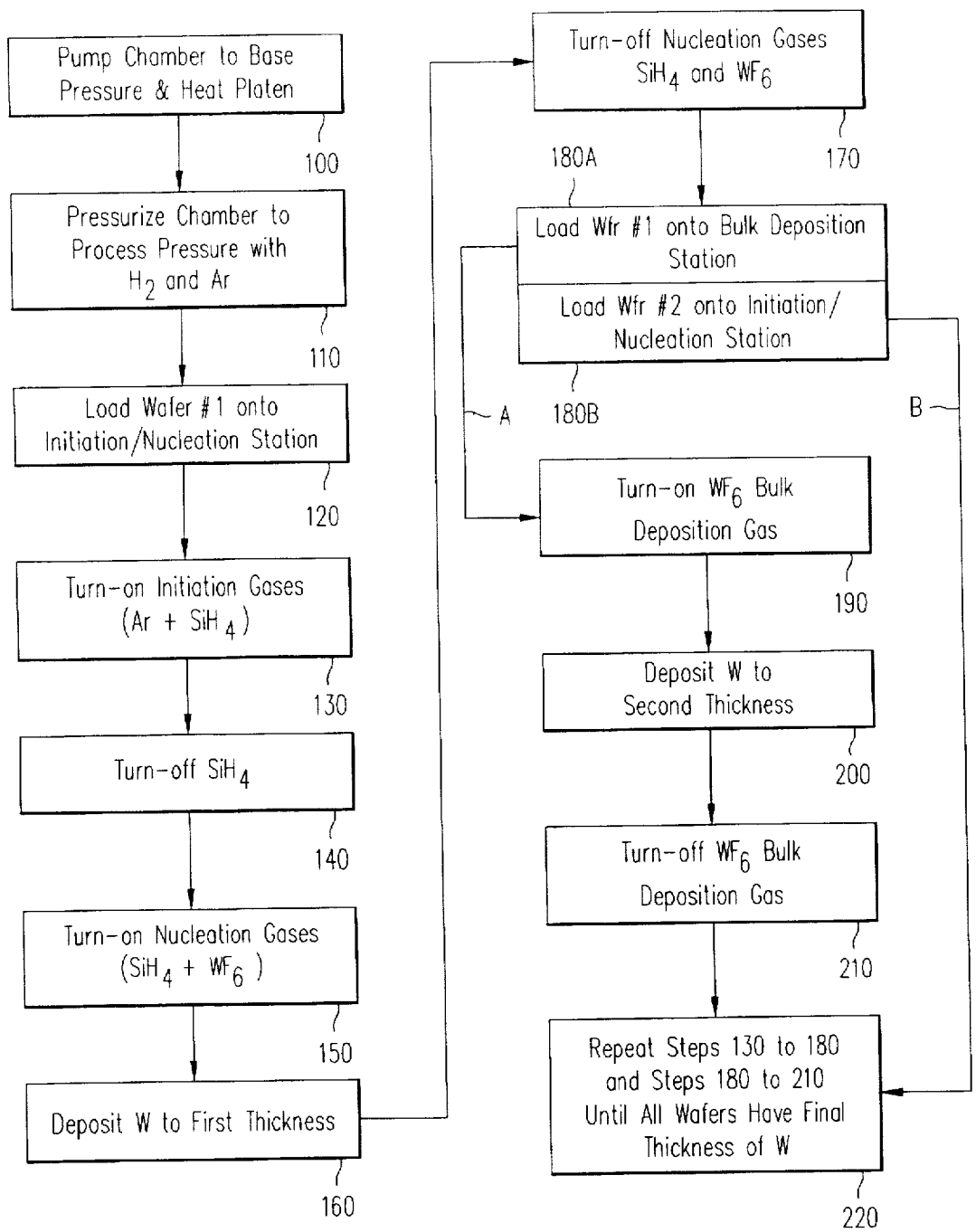
FIG. 2 is a block diagram illustrating the steps of a prior art deposition process that can be performed in the system of FIG. 1.

Turning now to FIG. 2, the steps of the prior art deposition process are illustrated in block diagram format. In describing these steps, all reference to elements of a deposition system will be understood to be the system of FIG. 1.

In step 100, chamber 400 is pumped through vacuum port 470 to a predetermined base pressure. Typically, this base pressure is less than approximately 20 milliTorr (mT), although other appropriate pressures can be employed. Once the base pressure is achieved, step 110 provides for pressurizing chamber 400 with $H_2$ and Ar, provided through stations 300 and 310 from distribution manifold 350, to a pressure of between approximately 40 to 80 Torr (T). Typically, the flow rates of the $H_2$ and Ar are each between approximately 4 to 15 standard liters per minute (slm). As known, this sequence of pumping to a low base pressure and subsequent pressurization to a higher pressure serves to clean chamber 400 of atmospheric contaminants and provide a clean background atmosphere for the deposition process.

A first wafer or substrate is placed into chamber 400 and onto initiation/nucleation station 300 which has been heated to between approximately 350 to 475 degrees Centigrade (°C.), step 120. When the temperature has been reached, the flow of initiation gases is begun, step 130. The initiation gases of the prior art method are $SiH_4$ and Ar as supplied from manifold 320 at flow rates of approximately 15 to 75 and 1000 standard cubic centimeters per second (sccm), respectively. This flow is continued for a predetermined time, typically about 20 seconds or less, and the flow of $SiH_4$ stopped, step 140, just prior to beginning the flow of nucleation gases, step 150. Nucleation gas flow consists of $WF_6$ from manifold 350 as well as $SiH_4$ and Ar from manifold 320. Typically, the $WF_6$ flow rate from manifold 350 is between approximately 150 to 800 sccm and flow rates of $SiH_4$ and Ar from manifold 320 are as previously described. It will be understood, that while Ar is provided to station 310 during step 150, it's flow is continuous, and not switched on as are the $WF_6$ and $SiH_4$ from manifolds 350 and 320, respectively.

The presence of the nucleation gases provides for the growth of a W film at a rate of approximately 250 to 330 nm/min. Once a first thickness of W has been formed, step 160, all $WF_6$ and $SiH_4$ flow is stopped, step 170, and the wafer or substrate on first station 300 is transferred to a second or bulk deposition station 310, step 180A. Once station 300 is cleared, another wafer or substrate is loaded, step 180B, and steps 130 to 180A, step 220B, repeated until all wafers have the first thickness of W deposited thereon. At essentially the same time, steps 190, 200 and 210 are performed to form a second thickness of W at a rate of approximately 60 to 380 nm/min. Where as shown in FIG. 1, there is one first or initiation/nucleation station 300 and four second or bulk deposition stations 310, each wafer will have deposited thereon one first thickness of W and four second thickness of W. It is the sum of these individual depositions that forms the total amount of W deposited.

While the method described above, produces W films, it can be subject to GPN and/or Device Attack. As previously mentioned, process conditions that reduce GPN favor Device Attack and visa versa, thus the prior art method requires that a delicate balance between the two effects be maintained. Typically, maintaining this balance involves adjusting the $SiH_4$ flow is to slightly favor GPN. The amount of GPN that occurs is usually monitored using laser based, in-situ particle monitoring systems (not shown) to sample the chamber atmosphere, and not by measuring a particle count on an actual wafer. For a system, such as the one described in FIG. 1, having an in-situ monitor sensitive to particles greater than or equal to 0.2 micron (µm), and running a process slightly favoring GPN, a count of between approximately 250 to 400 particles per second (part/sec) is typical.

Figure 3:
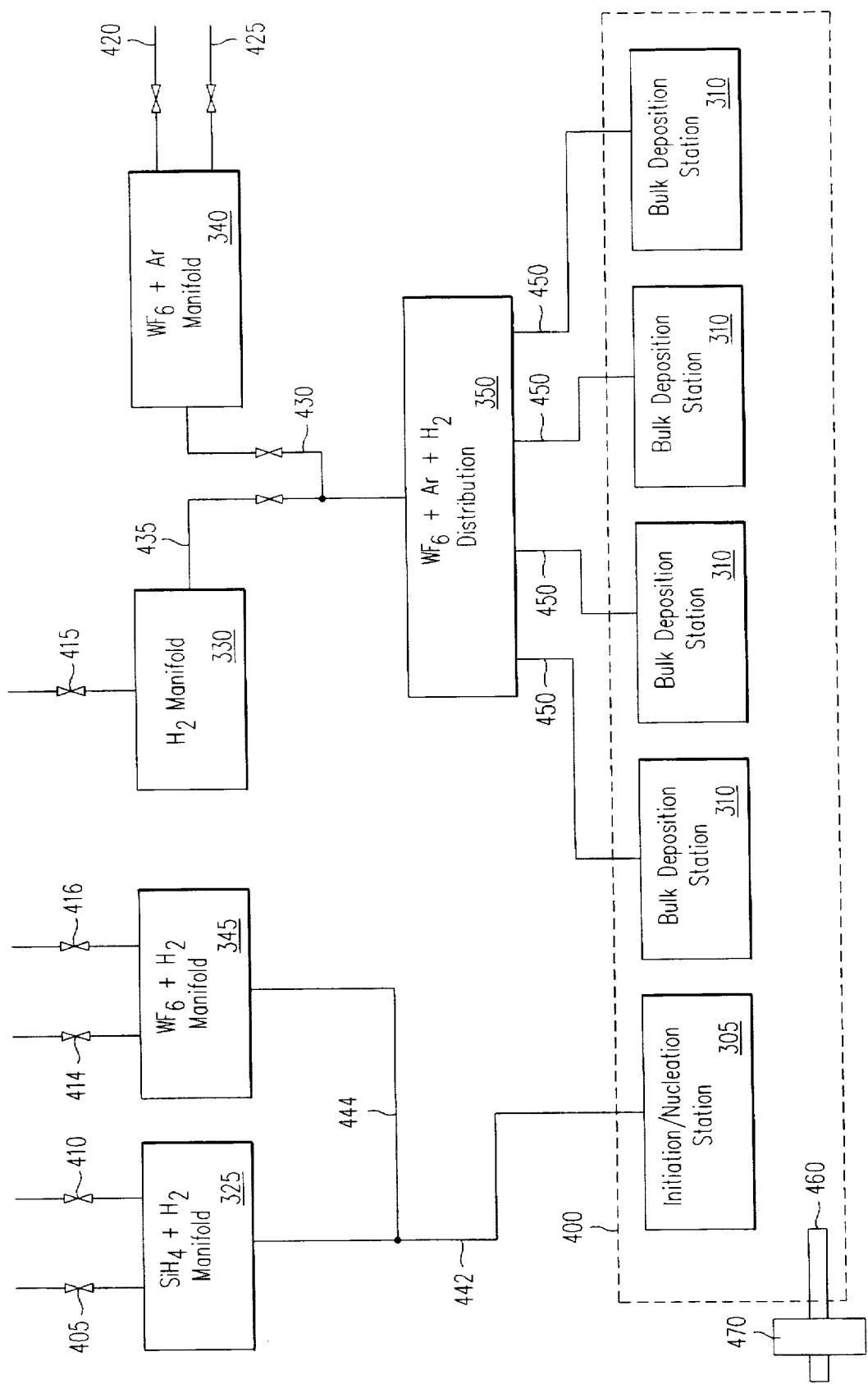
FIG. 3 is a schematic diagram of a deposition system capable deposition of a tungsten film in accordance with the method of the present invention.

Turning now to FIG. 3, a system for forming W films in the manner of the subject invention is shown. The system of FIG. 3 is similar to the system of FIG. 1, hence only those structures that are changed from FIG. 1 are numbered differently. Thus, initiation/nucleation station 305 is supplied with $SiH_4$ and $H_2$ from manifold 325 and $WF_6$ and $H_2$ from manifold 345. Manifold 325 has an input 412 from a $H_2$ source, (not shown), and manifold 345 an input 416 from another $H_2$ source (not shown). In this manner, different flows of $H_2$ can be provided for each manifold. It will be noted that other than the absence of any coupling to the nucleation station, manifold 350 and its connections to supply manifolds 330 and 340, and to stations 310 are as previously described for FIG. 1. Also, chamber 400, pressure control device 460, vacuum pumping port 470, each bulk deposition station 310 and all heating and transport mechanisms (not shown) are as previously described.

Figure 4:
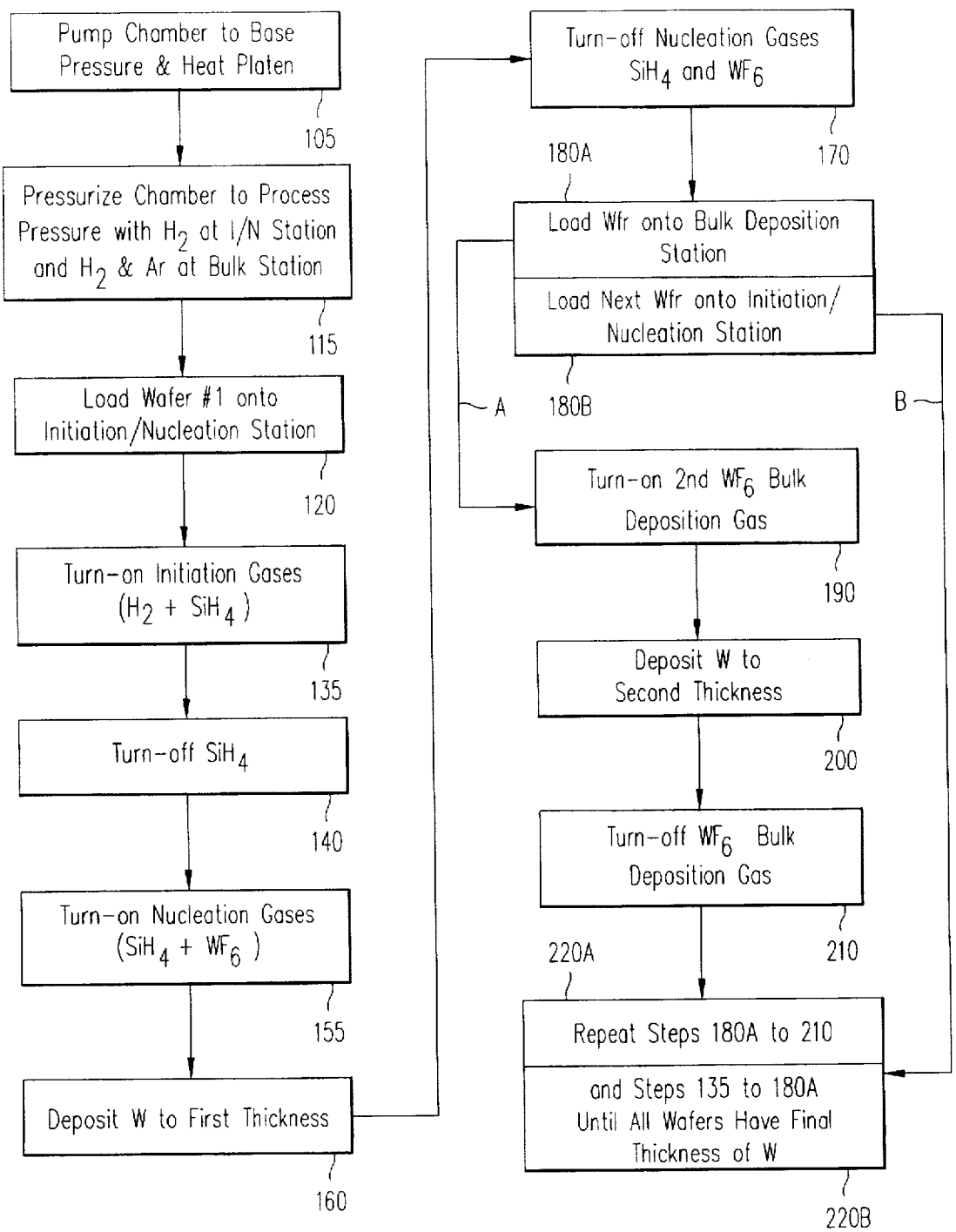
FIG. 4 is a block diagram illustrating the steps of a deposition process in the manner of the present invention.

Referring to FIG. 4, the steps of a deposition process in the manner of the present invention are illustrated in block diagram format. In describing these steps, all reference to elements of a deposition system will be understood to be the system of FIG. 3.

As previously described with respect to step 100 of FIG. 2, in step 105 of FIG. 4, chamber 400 is pumped to a predetermined base pressure, typically, less than approximately 20 mT, although other appropriate pressure can be employed. Once the base pressure is achieved, step 115 provides for pressurizing chamber 400, with $H_2$ through manifold 345 coupled to station 305, and with Ar and $H_2$ through manifold 350 coupled to each station 310, to a pressure of between approximately 40 to 80 T. Thus, unlike the prior art process, no Ar is supplied to initiation/nucleation station 305 (station 300 in FIG. 1). As discussed with respect to FIG. 2 this sequence of pumping to a low pressure pressurizing to a higher pressure serves to purge chamber 400 of gaseous contaminants. However, unlike the prior art method, only $H_2$ is provided to station 305, thus providing a local atmosphere essentially free of Ar.

A first wafer or substrate is placed into chamber 400 and onto initiation/nucleation station 305, step 120, and initiation gas flow is started, step 135. In accord with the present invention, the initiation gases used are $SiH_4$ and $H_2$ as supplied from manifold 325. The flow rate of $SiH_4$ is between approximately 15 to 75 sccm and that of $H_2$, approximately 1000 sccm. In this manner a local atmosphere about the substrate is created. The $SiH_4$ flow is continued, as described previously, for a short predetermined time and stopped, step 140. Step 155, then begins the flow of the nucleation gases. In some embodiments of the present invention, nucleation gas flow consists of $H_2$ and $WF_6$ supplied to station 305 from manifold 345 and $SiH_4$ and $H_2$ supplied to station 305 from manifold 325. The approximate range of flow rates for each gas at station 305 are 1 to 15 slm of $H_2$, 50 to 800 sccm of $WF_6$ and 15 to 75 sccm of $SiH_4$. Thus, the nucleation gas flow of step 155, adds a separately controlled supply of $WF_6$ and $H_2$ to station 305. As was seen for steps 115 and 135, step 155 also provides gas flow to station 305 that is without Ar.

As described for the prior art process, the presence of nucleation gases at station 305 initiates the growth of a W film. However, in contrast to the prior art process, the W deposition rate is found to be approximately 540 nm/min, an increase of about 47%. In addition, this rate is also over 6 times the W deposition rate reported Cumpian et al., in the previously mentioned reference, as a deposition rate plateau.

Once a first thickness of W has been formed, step 160, the $SiH_4$ and $WF_6$ flows are stopped, step 170, and the wafer or substrate on station 305 is transferred to a first bulk deposition station 310, step 180A. Then, another wafer or substrate is loaded onto station 305, step 180B, and steps 135 to 180A, step 220B, repeated until all wafers have the first thickness of W deposited thereon. At essentially the same time, steps 190, 200 and 210 are performed to form a second thickness of W. In step 190, $WF_6$ flow is started at manifold 340 and coupled to station 310 through distribution manifold 350. Thus a second local atmosphere of gases, $WF_6$, $H_2$ and Ar, is formed about the substrate at each station 310. The flow of $WF_6$ is continued until a second thickness of W is formed, step 200, and the $WF_6$ turned off, step 210. Where, as shown in FIG. 3, there is a single initiation/nucleation station 305 and four bulk deposition stations 310, each wafer will have deposited thereon one first thickness of W and four second thickness of W. It is the sum of these individual depositions that forms the total amount of W deposited.

It should be noted that the approximately 47% increase in deposition rate over the prior art process discussed with respect to FIG. 2 and the greater than 6-fold increase over the rate reported by Cumpian et al. as a plateau, is unexpected. As previously discussed herein and by Cumpian et al., $H_2$ reduction of $WF_6$ is rate limited by the dissociation of the $H_2$ on an active surface. Thus an increase in $H_2$ concentration above that amount which can absorb on the active surface should not increase the W deposition rate. Thus a plateau in the W deposition rate under such reaction conditions is expected (see Cumpian et al., FIG. 3, on p. 533).

It should also be noted, that as embodiments of the present invention reduce or eliminate GPN and/or Device Attack, that process conditions that slightly favor GPN are not required. Hence, embodiments of the present invention use process conditions that are optimized for the best possible film nucleation and growth. Thus, it has been found through in-situ process monitoring (not shown), that the number of particles greater than or equal to 0.2 µm is essentially zero, due to GPN, while also maintaining essentially no Device Attack.

Thus embodiments of the present invention have been described that provide a method for the initiation/nucleation of a W film with reduced Device Attack and GPN while maintaining a high W deposition rate. One of ordinary skill in the art will realize that while the description herein illustrate specific embodiments of the present invention, other embodiments are possible that are within the spirit and scope of the present invention.

I claim:

1. A method for initiating growth of a tungsten (W) film on a surface of a semiconductor substrate comprising:

positioning said semiconductor substrate at a deposition station within a deposition chamber;

heating said semiconductor wafer to a temperature between approximately 350 to 475 degrees Centigrade at said deposition station;

providing initiation gases to said surface, wherein said initiation gases consist of hydrogen ($H_2$) and silane ($SiH_4$); and providing nucleation gases to said surface, wherein said nucleation gases replace said initiation gases, said nucleation gases consisting of tungsten hexafluoride ($WF_6$), $H_2$ and $SiH_4$, and wherein said tungsten film is formed at a rate in excess of approximately 100 nm/min on said surface.

2. The method of claim 1 wherein providing initiation gases to said surface and providing nucleation gases to said surface each create a local atmosphere about said deposition station.

3. The method of claim 1 further comprising:

repositioning said semiconductor substrate to a second deposition station;

providing second deposition gases to said surface, wherein said second deposition gases comprise $WF_6$, $H_2$ and Ar and wherein said tungsten film continues to form at a rate in excess of approximately 100 nm/min on said surface.

4. The method of claim 3 wherein providing initiation gases and nucleation gases to said surface create a local atmosphere about said deposition station, and wherein providing second deposition gases to said surface creates a local atmosphere about said second deposition station.

5. A method for forming a tungsten (W) film on a substrate surface, comprising:

positioning said substrate at a first deposition station within a deposition chamber;

heating said substrate, at said first deposition station, to between approximately 350 to 475 degrees Centigrade;

flowing hydrogen ($H_2$) and silane ($SiH_4$) gases, without argon gas, to said substrate surface wherein a first local atmosphere is formed;

adding tungsten hexafluoride ($WF_6$) to said first local atmosphere wherein a first thickness of said W film is formed on said substrate surface;

repositioning said substrate at a second deposition station within said deposition chamber; and flowing $H_2$, argon (Ar) and $WF_6$ gases to said substrate surface at said second station wherein a second local atmosphere is formed, and wherein a second thickness of said W film is formed on said substrate surface.

6. The method of claim 5 wherein adding $WF_6$ to said first local atmosphere to form a first thickness of said tungsten film comprises growing said first thickness at a rate in excess of approximately 100 nm/min.

* * * * *